(12) United States Patent
Matsutori (10) Patent No.: US 12,374,573 B2
(45) Date of Patent: Jul. 29, 2025

(54) SUBSTRATE STORING CONTAINER (71) Applicant: MIRAIAL CO., LTD., Tokyo (JP)

(72) Inventor: Chiaki Matsutori, Tokyo (JP)

(73) Assignee: MIRAIAL CO., LTD., Tokyo (JP)

( * ) Notice: Subject to any disclaimer, the term of this patent is extended or adjusted under 35 U.S.C. 154(b) by 42 days.

(21) Appl. No.: 18/573,927

(22) PCT Filed: Jun. 21, 2021

(86) PCT No.: PCT/JP2021/023474
§ 371 (c)(1),
(2) Date: Dec. 22, 2023

(87) PCT Pub. No.: WO2022/269718
PCT Pub. Date: Dec. 29, 2022

(65) Prior Publication Data
US 2024/0145284 A1   May 2, 2024

(51) Int. Cl.
*H01L 21/673* (2006.01)
*B65D 85/30* (2006.01)

(52) U.S. Cl.
CPC .............. *H01L 21/67389* (2013.01)

(58) Field of Classification Search
CPC ............ H01L 21/673; H01L 21/67389; H01L 21/67366; H01L 21/67393; B65D 85/30
USPC .................. 206/454, 710, 711, 832
See application file for complete search history.

(56) References Cited

U.S. PATENT DOCUMENTS

| | | | | |
|---|---|---|---|---|
| 5,879,458 A * | 3/1999 | Roberson, Jr. | .... | H01L 21/67769 414/217 |
| 10,879,099 B2 * | 12/2020 | Yang | ................ | C23C 16/45563 |
| 10,923,373 B2 * | 2/2021 | Ogawa | .............. | H01L 21/67379 |
| 10,937,677 B2 * | 3/2021 | Woo | ....................... | B08B 9/0321 |
| 11,011,399 B2 * | 5/2021 | Matsutori | ......... | H01L 21/67393 |
| 11,646,214 B2 * | 5/2023 | Ogawa | .............. | H01L 21/67383 206/710 |

(Continued)

FOREIGN PATENT DOCUMENTS

| JP | 2011514014 A | 4/2011 |
|---|---|---|
| JP | 2013513951 A | 4/2013 |

(Continued)

OTHER PUBLICATIONS

International Preliminary Report on Patentability issued to PCT Application No. PCT/JP2021/023474 and English translation, mailed Aug. 1, 2023, Date of preparation of the international preliminary examination report : Jul. 21, 2023, 11 pages.

*Primary Examiner* — Luan K Bui
(74) *Attorney, Agent, or Firm* — Muncy, Geissler, Olds & Lowe, P.C.

(57) ABSTRACT

A substrate storing container includes: a gas ejection nozzle unit having a plurality of apertures for supplying to the substrate storing space a gas that has flowed into the ventilation paths; and a gas flow rate equalizer capable of causing the gas to flow out from the plurality of apertures at an equalized flow rate. The gas flow rate equalizer includes a gas detention chamber, a pre-outflow gas retention chamber, and inter-chamber partitions defining an inter-chamber flow path that blocks straight-line communication between the gas detention chamber and the pre-outflow gas retention chamber but allows for communication between the gas detention chamber and the pre-outflow gas retention chamber.

10 Claims, 9 Drawing Sheets

(56) References Cited

U.S. PATENT DOCUMENTS 11,820,575 B2 * 11/2023 Aramaki ............... B65D 85/02
2020/0020549 A1 1/2020 Ogawa et al.

FOREIGN PATENT DOCUMENTS

| | | |
|---|---|---|
| JP | 3198841 U | 7/2015 |
| JP | 20164949 A | 1/2016 |
| JP | 2016538732 A | 12/2016 |
| JP | 201717264 A | 1/2017 |
| JP | 2019216258 A | 12/2019 |
| KR | 1020200011290 A | 2/2020 |
| WO | WO-2009114798 A2 | 9/2009 |
| WO | WO-2011072260 A2 | 6/2011 |
| WO | WO-2015057739 A1 | 4/2015 |
| WO | WO-2018179964 A1 | 10/2018 |
| WO | WO-2021014653 A1 | 1/2021 |

* cited by examiner

SUBSTRATE STORING CONTAINER

TECHNICAL FIELD

The present invention relates to a substrate storing container for use to accommodate, store, and transport substrates such as semiconductor wafers, reticles, and printed circuit boards.

BACKGROUND ART

A known substrate storing container for storing various types of substrates includes a container body and a lid.

The container body has a container body opening at one end thereof. The container body has a wall with a closed tubular shape at the other end thereof. The container body includes therein a substrate storing space. The substrate storing space is surrounded and defined by the wall, and is capable of storing substrates therein. The lid is detachably attachable to the container body opening, and can close the container body opening. Lateral-side substrate supports are provided on the wall such that the lateral-side substrate supports form counterparts to each other in the substrate storing space. When the container body opening is not closed by the lid, the lateral-side substrate supports can support edge portions of the substrates such that the adjacent substrates are arranged in parallel at predetermined intervals.

The lid is provided with a front retainer (lid-side substrate supports) on a portion thereof that faces the substrate storing space in a state where the container body opening is closed by the lid. The front retainer can support edge portions of the substrates in the state where the container body opening is closed by the lid. Back-side substrate supports are provided on the wall such that the back-side substrate supports form counterparts to the front retainer. The back-side substrate supports can support edge portions of the substrates. In the state where the container body opening is closed by the lid, the back-side substrate supports support the substrates in cooperation with the front retainer, and thereby support the substrates such that the adjacent substrates are arranged in parallel at predetermined intervals.

CITATION LIST

Patent Document

Patent Document 1: Japanese Unexamined Patent Application (Translation of PCT Application), Publication No. 2016-538732
Patent Document 2: Japanese Unexamined Patent Application, Publication No. 2017-17264
Patent Document 3: Japanese Unexamined Patent Application, Publication No. 2016-004949

DISCLOSURE OF THE INVENTION

Problems to be Solved by the Invention

In a substrate storing container having a scavenging hole functioning as a ventilation hole that allows for communication between the substrate storing space and the outside of the substrate storing container, clean dry air (CDA) or nitrogen ($N_2$) is used as a purge gas in a state in which the lid is detached. The purge gas is supplied from a load port provided outside the substrate storing container, and then, flows through a through-hole from a bottom surface (outer surface) of the container body to be introduced into a gas ejection nozzle unit disposed on the inner surface of the substrate storing container. In this way, the gas purge is performed. At this time, in order to reliably perform replacement of the purge gas by way of the gas purge, it is required that the purge gas be equally supplied from a plurality of apertures of the gas ejection nozzle unit.

An object of the present invention is to provide a substrate storing container capable of equally supplying a gas from a plurality of apertures of a gas ejection nozzle unit in a substrate storing space.

Means for Solving the Problems

The present invention relates to a substrate storing container including: a container body having an opening peripheral edge defining a container body opening at one end thereof, and a wall with a closed tubular shape at the other end thereof, and including a substrate storing space formed therein, the substrate storing space being defined by an inner surface of the wall, being capable of storing a substrate, and communicating with the container body opening; a lid detachably attachable to the container body opening and capable of closing the container body opening; a ventilation path allowing for communication between the substrate storing space and a space outside the container body; a gas ejection nozzle unit having a plurality of apertures for supplying to the substrate storing space a gas that has flowed into the ventilation path; and a gas flow rate equalizer capable of causing the gas to flow out from the plurality of apertures at an equalized flow rate. The gas flow rate equalizer includes a gas detention chamber, a pre-outflow gas retention chamber, and an inter-chamber partition, the inter-chamber partition defining an inter-chamber flow path that blocks straight-line communication between the gas detention chamber and the pre-outflow gas retention chamber but allows for communication between the gas detention chamber and the pre-outflow gas retention chamber.

Preferably, the gas flow rate equalizer further includes a partition wall that partitions the pre-outflow gas retention chamber into a plurality of pre-outflow gas retention sub-chambers. Preferably, the plurality of pre-outflow gas retention sub-chambers have an equal capacity. Preferably, the gas detention chamber is partitioned into a plurality of gas detention sub-chambers by an inter-sub-chamber partition. Preferably, a gas supply flow path communicating with all the gas detention sub-chambers is formed.

Preferably, the gas ejection nozzle unit includes a nozzle chamber that is in communication with the apertures, and the nozzle chamber communicates with the pre-outflow gas retention chamber via a hydrophobic film. Preferably, the nozzle chamber communicates with all the apertures and all the gas pre-outflow gas retention sub-chambers. Preferably, the gas ejection nozzle unit has a flow-directing part that causes the gas to flow out from the aperture in a predetermined direction.

Preferably, the apertures are formed to correspond to a plurality of substrates stored in the substrate storing space on a one-to-one basis. Preferably, the substrate storing container includes a columnar protrusion part including the gas ejection nozzle unit and the gas flow rate equalizer, a base of the protrusion part is fitted into a hole formed in the wall of the container body, constituting the ventilation path, and provided with a sealing member, and an end portion of the protrusion part is fastened to the wall of the container body, whereby the protrusion part is fastened to the container body.

Effects of the Invention

The present invention provides the substrate storing container capable of equally supplying a gas from the plurality of apertures of the gas ejection nozzle unit in the substrate storing space.

PREFERRED MODE FOR CARRYING OUT THE INVENTION

[Overall Configuration of Substrate Storing Container 1]

Figure 1:
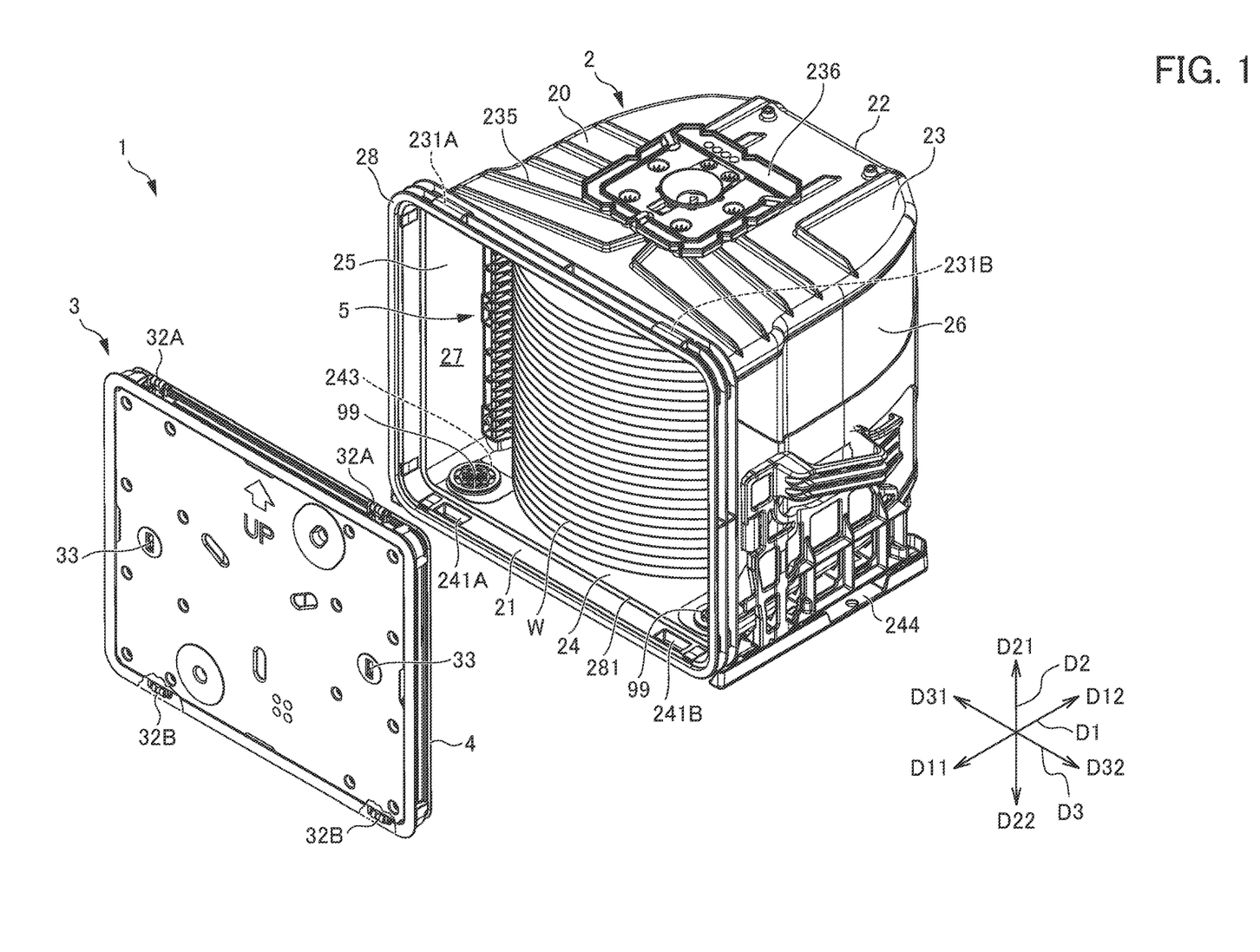
FIG. 1 is an exploded perspective view illustrating a substrate storing container 1 according to an embodiment of the present invention that has a plurality of substrates W stored therein.
Figure 2:
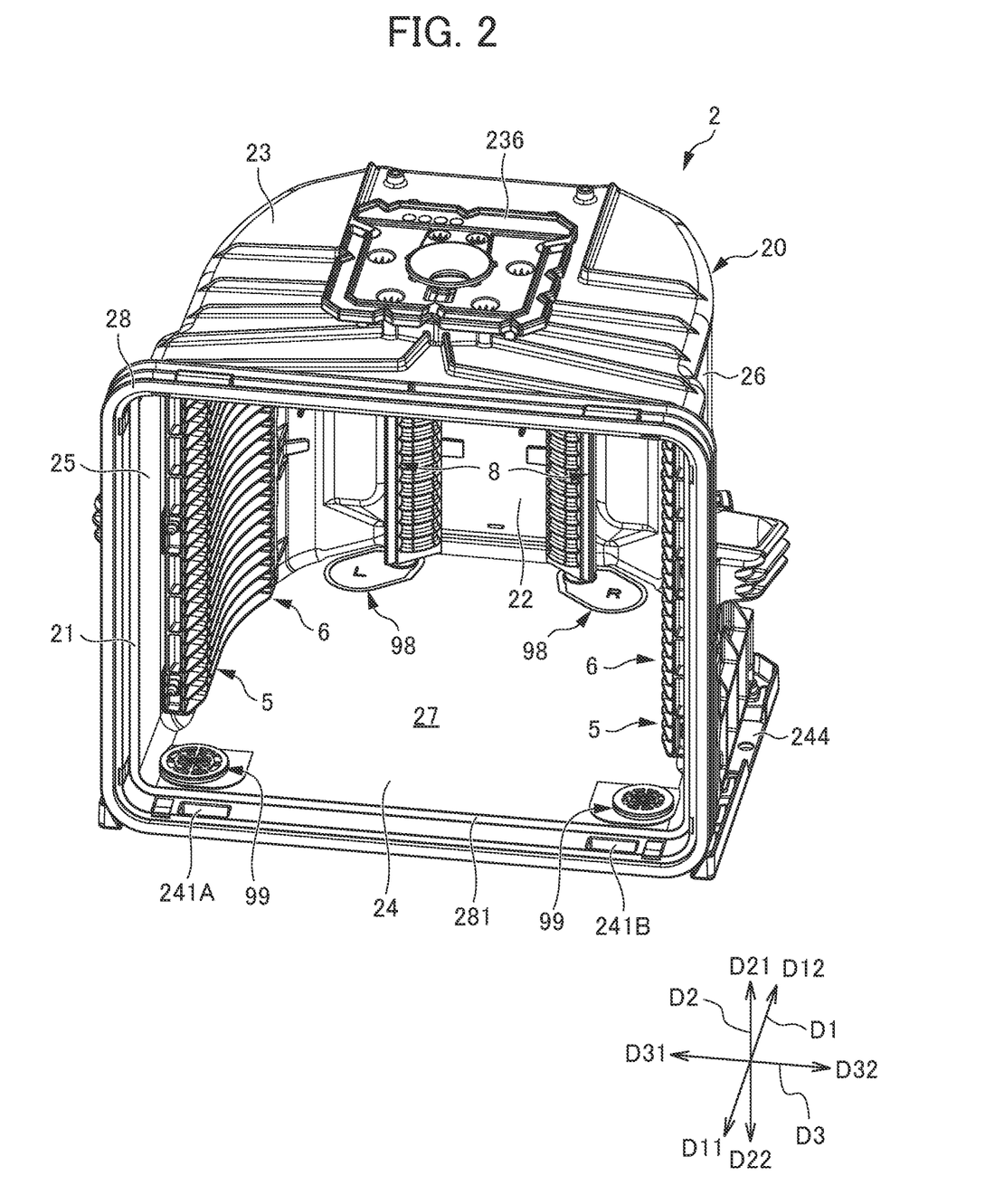
FIG. 2 is an upper perspective view illustrating a container body 2 of the substrate storing container 1 according to the embodiment of the present invention.
Figure 3:
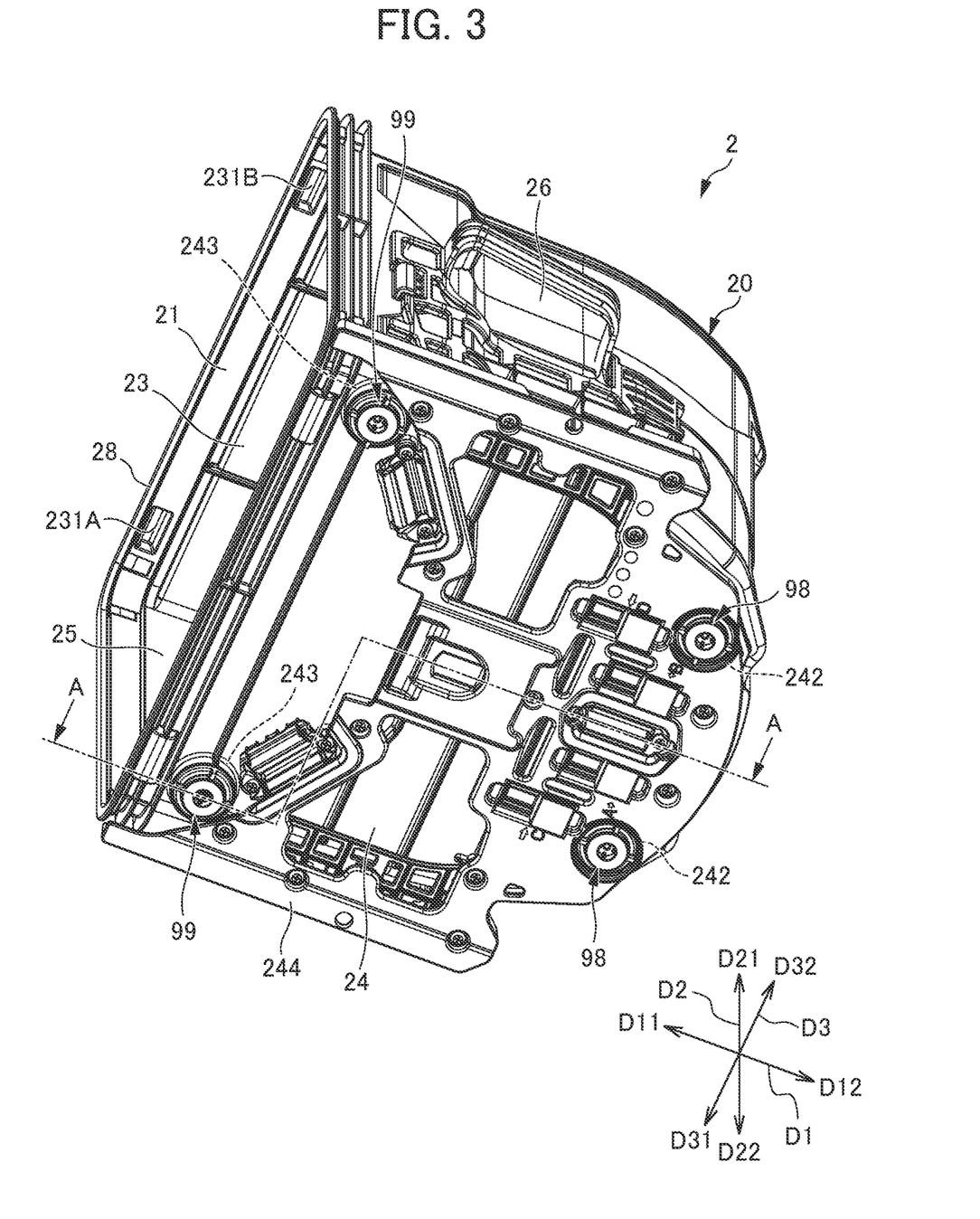
FIG. 3 is a lower perspective view illustrating the container body 2 of the substrate storing container 1 according to the embodiment of the present invention.
Figure 4:
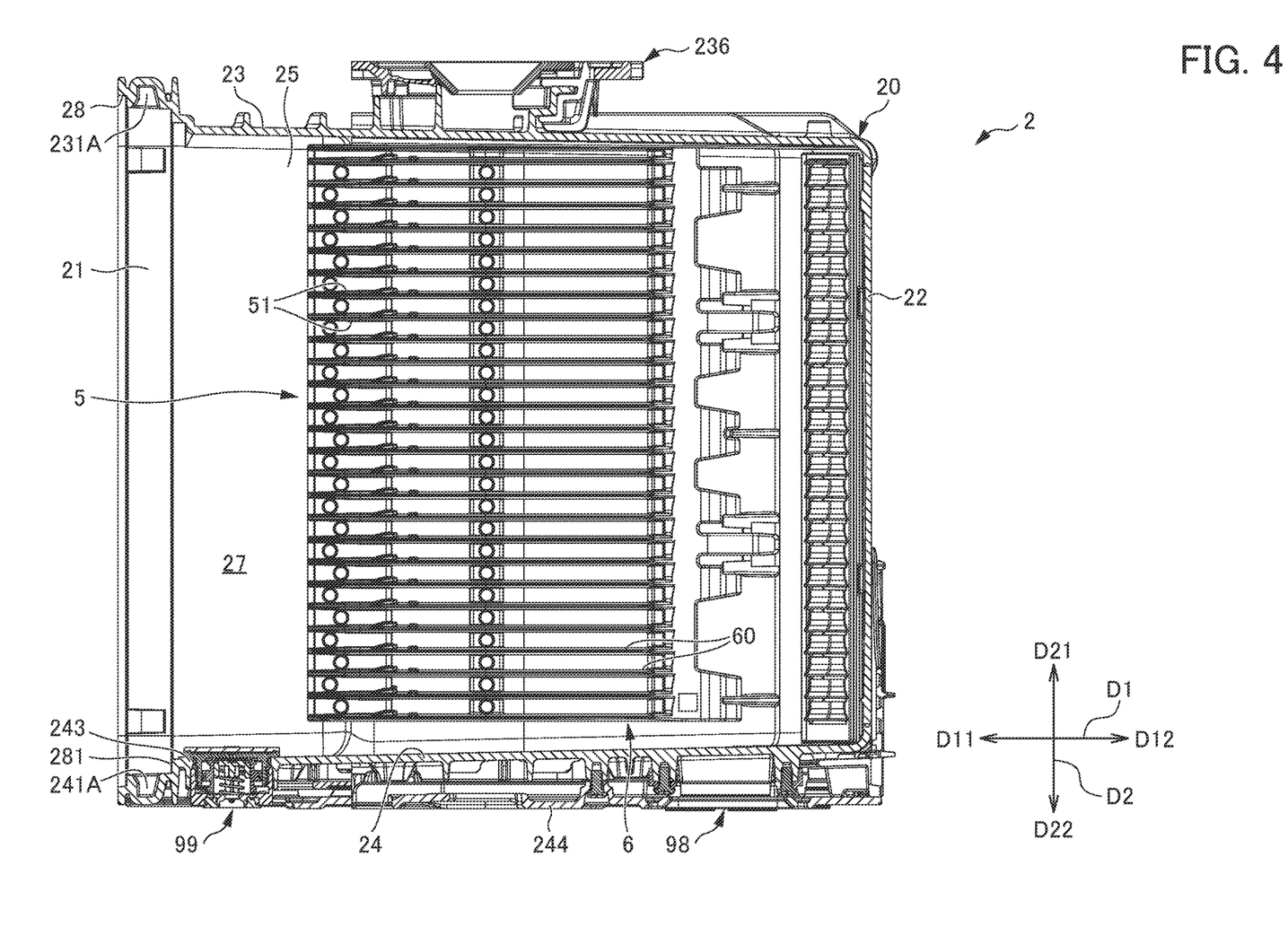
FIG. 4 is a side cross-sectional view of the container body 2, taken along line A-A of FIG. 3.

A substrate storing container 1 according to an embodiment will be described below with reference to the drawings. FIG. 1 is an exploded perspective view illustrating the substrate storing container 1 having a plurality of substrates W stored therein. FIG. 2 is an upper perspective view illustrating a container body 2 of the substrate storing container 1. FIG. 3 is a lower perspective view illustrating the container body 2 of the substrate storing container 1. FIG. 4 is a side cross-sectional view of the container body 2, taken along line A-A of FIG. 3.

Here, for the sake of convenience of description, the direction from the container body 2 (to be described later) toward a lid 3 (to be described later) (i.e., the direction from the upper right toward the lower left in FIG. 1) is defined as the forward direction D11, the direction opposite to the forward direction D11 is defined as the backward direction D12, and the forward and backward directions are collectively defined as the forward/backward direction D1. The direction from a bottom wall 24 (to be described later) toward a top wall 23 (to be described later) (i.e., the upward direction in FIG. 1) is defined as the upward direction D21, the direction opposite to the upward direction D21 is defined as the downward direction D22, and the upward and downward directions are collectively defined as the upward/downward direction D2. The direction from a second side wall 26 (to be described later) toward a first side wall 25 (to be described later) (i.e., the direction from the lower right toward the upper left in FIG. 1) is defined as the left direction D31, the direction opposite to the left direction D31 is defined as the right direction D32, and the left and right directions are collectively defined as the left/right direction D3. The principal figures show arrows indicating the foregoing directions.

Each of the substrates W (see FIG. 1) that are stored in the substrate storing container 1 is a thin substrate for industrial use, and examples thereof include a disk-shaped silicon wafer, a disk-shaped glass wafer, and a disk-shaped sapphire wafer. Each substrate W of the present embodiment is a silicon wafer having a diameter of 300 mm.

As illustrated in FIGS. 1 to 4, the substrate storing container 1 is for use as an in-process container for storing and carrying the substrates W, each of which includes the silicon wafer described above, in a process in a factory, and as a shipping container for transporting the substrates by transportation means such as land transport, air transport, and sea transport. The substrate storing container 1 includes the container body 2 and the lid 3. The container body 2 includes substrate support plates 5 configured as lateral-side substrate supports, and back-side substrate supports 6. The lid 3 includes a front retainer (not shown) as lid-side substrate supports.

The container body 2 has a container body opening 21 at one end thereof, and has a wall 20 with a closed tubular shape at the other end thereof. The container body 2 includes therein a substrate storing space 27. The substrate storing space 27 is surrounded and defined by the wall 20. The substrate support plates 5 are disposed adjacent to portions of the wall 20 that define the substrate storing space 27. As illustrated in FIG. 1, a plurality of substrates W can be stored in the substrate storing space 27.

The substrate support plates 5 are interior members arranged to form counterparts to each other in the substrate storing space 27, and are detachably fastened to the wall 20. When in contact with edge portions of the plurality of substrates W, the substrate support plates 5 can support the edge portions of the plurality of substrates W such that the adjacent substrates W are arranged in parallel at predetermined intervals. The back-side substrate supports 6 are located backward of the substrate support plates 5 and are formed integrally with the substrate support plates 5.

The back-side substrate supports 6 are provided on the wall 20 such that the back-side substrate supports 6 form counterparts to the front retainer (not shown) in the substrate storing space 27. When in contact with edge portions of the plurality of substrates W, the back-side substrate supports 6 can support backward edge portions of the plurality of substrates W.

The lid 3 is detachably attachable to an opening peripheral edge 28 that defines the container body opening 21, and can close the container body opening 21. The front retainer (not shown) is provided on a portion of the lid 3, which faces the substrate storing space 27 in a state where the container body opening 21 is closed by the lid 3. The front retainer is disposed so as to form a counterpart to the back-side substrate supports 6 in the substrate storing space 27.

When in contact with edge portions of the plurality of substrates W in the state where the container body opening 21 is closed by the lid 3, the front retainer can support front edge portions of the plurality of substrates W. In the state where the container body opening 21 is closed by the lid 3, the front retainer holds the plurality of substrates W in cooperation with the back-side substrate supports 6 such that the adjacent substrates W are arranged in parallel at predetermined intervals.

The substrate storing container 1 is made of a resin such as a plastic material. Unless otherwise specified, examples of the resin as the material include thermoplastic resins such as polycarbonates, cycloolefin polymers, polyetherimide, polyether ketone, polybutylene terephthalate, polyether ether ketone, and liquid crystal polymers, and alloys thereof. A conductive substance, such as carbon fibers, carbon powder, carbon nanotubes, a conductive polymer, and the like, is selectively added to the foregoing resins as a molding material in a case where conductivity is to be imparted. It is also possible to add glass fibers, carbon fibers, or the like in order to increase the rigidity.

[Container Body 2]

In the following, each component will be described in detail. As illustrated in FIGS. 1 to 4, the wall 20 of the container body 2 includes a back wall 22, the top wall 23, the bottom wall 24, the first side wall 25, and the second side wall 26. The back wall 22, the top wall 23, the bottom wall 24, the first side wall 25, and the second side wall 26 are made of one or more of the above-described materials, and are integrated into one piece.

The first side wall 25 and the second side wall 26 face each other, and the top wall 23 and the bottom wall 24 face each other. The back end of the top wall 23, the back end of the bottom wall 24, the back end of the first side wall 25, and the back end of the second side wall 26 are all connected to the back wall 22. The front end of the top wall 23, the front end of the bottom wall 24, the front end of the first side wall 25, and the front end of the second side wall 26 constitute the opening peripheral edge 28 that defines the container body opening 21 having a substantially rectangular shape.

The opening peripheral edge 28 is provided at the one end of the container body 2, and the back wall 22 is located at the other end of the container body 2. The outer surface of the wall 20 forms the outer shape of the container body 2, which is a box shape. The inner surface of the wall 20, that is, the inner surface of the back wall 22, the inner surface of the top wall 23, the inner surface of the bottom wall 24, the inner surface of the first side wall 25, and the inner surface of the second side wall 26 surround and define the substrate storing space 27. The container body opening 21 defined by the opening peripheral edge 28 communicates with the substrate storing space 27 surrounded by the wall 20 and formed in the container body 2. A maximum of 25 substrates W can be stored in the substrate storing space 27.

Latch engagement recesses 231A, 231B, 241A, and 241B, which are concave outward with respect to the substrate storing space 27, are formed in portions of the top wall 23 and the bottom wall 24 near the opening peripheral edge 28. A total of four latch engagement recesses 231A, 231B, 241A, and 241B are formed in proximity to the left and right ends of the top wall 23 and the left and right ends the bottom wall 24, on a one-to-one basis.

On the outer surface of the top wall 23, a rib 235 is formed integrally with the top wall 23. The rib 235 increases the rigidity of the container body 2. A top flange 236 is fixed to a central portion of the top wall 23. The top flange 236 is a member by means of which the substrate storing container 1 is hooked and hung in an automated wafer transport system (e.g., an AMHS), a wafer substrate transport cart (e.g., a PGV), or the like.

A bottom plate 244 is fixed to the bottom wall 24. The bottom plate 244 fixed to the bottom wall 24 has a substantially rectangular plate shape and is arranged to face substantially the entire lower surface constituting the outer surface of the bottom wall 24.

The bottom wall 24 has, near its four corners, intake openings 242 and discharge openings 243, which are two types of through holes. In the present embodiment, the two through holes formed at two locations in a front portion of the bottom wall 24 serve as the discharge openings 243 for discharging gas from the inside of the container body 2, and the two through holes formed at two locations in a back portion serve as the intake openings 242 for supplying gas to the inside of the container body 2.

The through holes as the intake openings 242 are each provided with an intake filter unit 98 as an additional component, and the through holes as the discharge openings 243 are each provided with a discharge filter unit 99. That is, a gas flow path in each intake filter unit 98 and a gas flow path in each discharge filter unit 99 form part of a ventilation path that allows for communication between the substrate storing space 27 and the space outside the container body 2. The intake filter units 98 and the discharge filter units 99 are disposed on the wall 20, and each allow gas to flow between the space outside the container body 2 and the substrate storing space 27 via a respective filter (not shown). A purge gas supplied to the intake filter units 98 is supplied to the substrate storing space 27. The discharge filter units 99 are configured to allow gas to pass therethrough, from the substrate storing space 27 to the space outside the container body 2.

[Protrusion Part 8]

Figure 5:
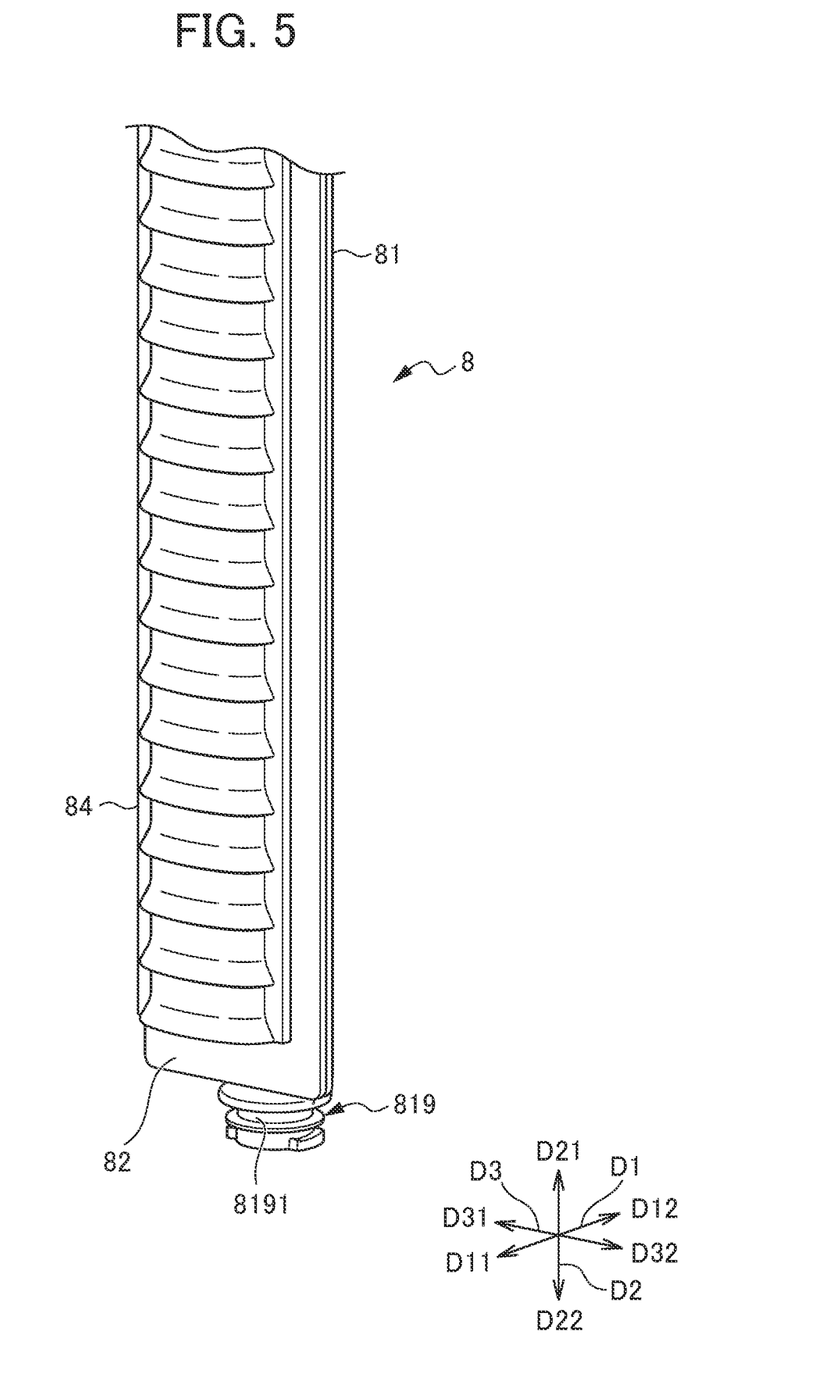
FIG. 5 is a perspective view illustrating a protrusion part 8 of the substrate storing container 1.
Figure 6:
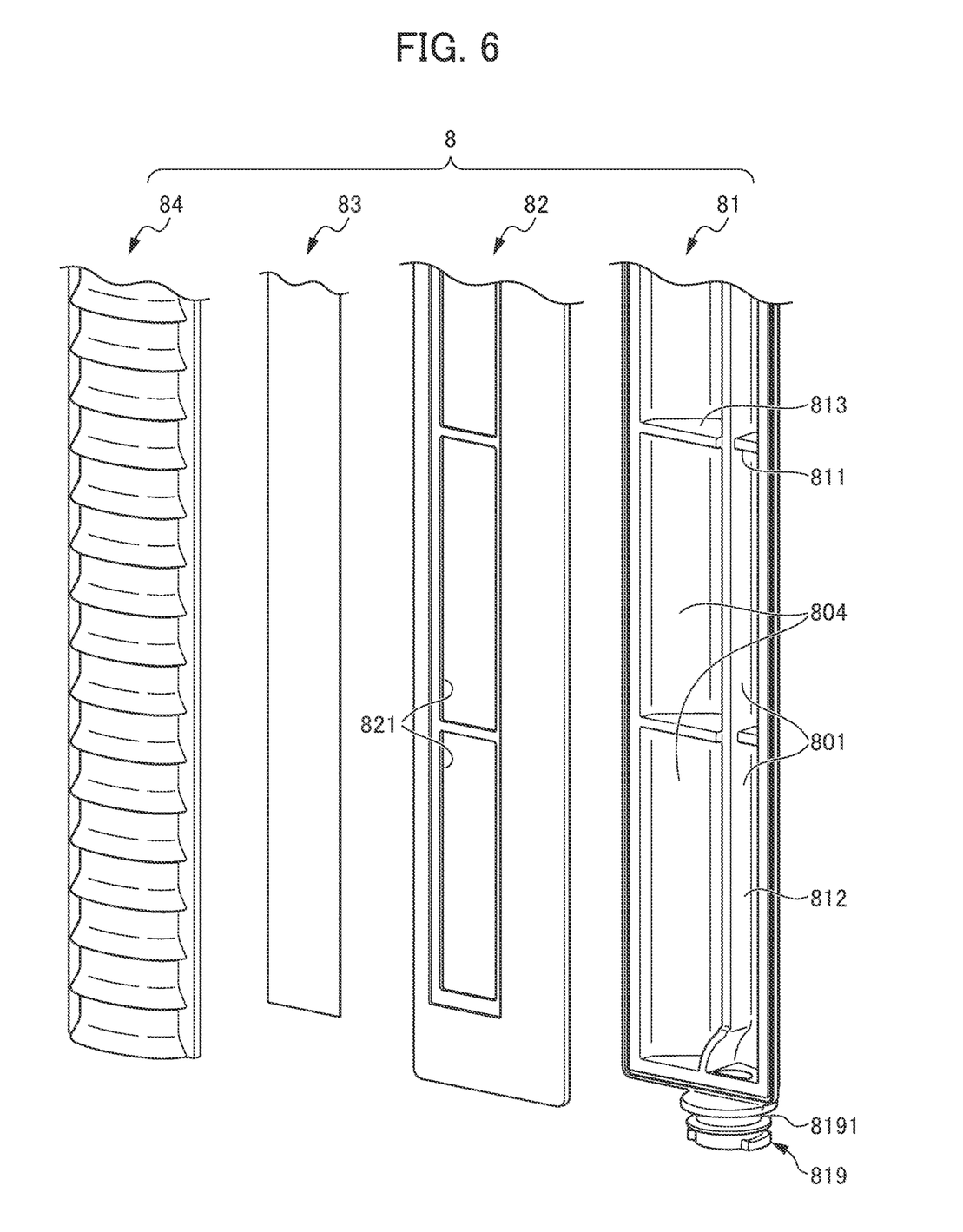
FIG. 6 is an exploded perspective view illustrating the protrusion part 8 of the substrate storing container 1.

The back wall 22 is provided with protrusion parts 8 (see FIG. 5) each functioning as a gas ejection nozzle unit. As illustrated in FIG. 6, each protrusion part 8 includes a protrusion part body 81, an inner wall component 82, a hydrophobic film 83, and a nozzle chamber forming component 84, which are fastened to each other in this order to thereby form the protrusion part 8.

Two protrusion parts 8 are provided to form counterparts to each other. Each protrusion part body 81 has a base 819 having an annular groove 8191 formed thereon and an O-ring (not shown) as a sealing member fitted in the annular groove 8191. The base 819 is fitted into one of two holes formed in the bottom wall 24 of the container body 2 near the two intake openings 242 such that the base 819 is in airtight communication with the ventilation path in the intake filter unit 98. Thus, by means of the plug-in structure, a total of two bases 819 are fitted into the two holes on a one-to-one basis, whereby the bases 819 are fastened to the bottom wall 24 of the container body 2. Each of the holes formed in the bottom wall 24 of the container body 2 is also provided with a sealing member (not shown) for sealing the base 819. An upper portion of each protrusion part 8, which is an end portion of the protrusion part 8, is fixed to the back wall 22 forming part of the wall 20, by snap fitting, welding, or the like.

Due to this configuration, the pair of protrusion parts 8 protrude in a rib-like shape toward the container body opening 21, and extend in parallel from an upper end portion to a lower end portion of the back wall 22. Each protrusion part 8 has a hollow columnar shape.

Each protrusion part 8 has a plurality of apertures 841 and a gas flow rate equalizer. The plurality of apertures 841 supply to the substrate storing space 27 a gas that has flowed into the ventilation path, which is the gas flow path in the intake filter unit 98 and which allows for communication between the substrate storing space 27 and the space outside the container body 2. The gas flow rate equalizer is capable of causing the gas to flow out of the plurality of apertures 841 at an equalized flow rate.

Specifically, the gas flow rate equalizer is provided between the ventilation path (gas flow path in the intake filter unit 98) that allows for communication between the substrate storing space 27 and the space outside the container body 2, and the apertures 841. The gas flow rate equalizer includes a gas detention chamber 801, a pre-outflow gas retention chamber 804, inter-chamber partitions (a body-side partition 812 and an inner wall-side partition 822) defining an inter-chamber flow path 806 that blocks straight-line communication between the gas detention chamber 801 and the pre-outflow gas retention chamber 804 but allows for communication between the gas detention chamber 801 and the pre-outflow gas retention chamber 804, and a nozzle chamber 803.

Figure 8:
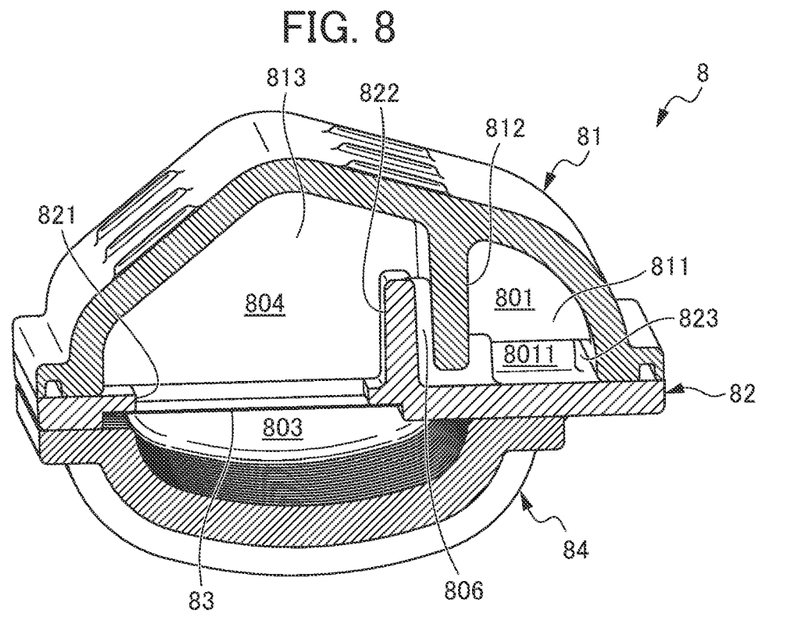
FIG. 8 is a rear perspective cross-sectional view illustrating the protrusion part 8 of the substrate storing container 1.
Figure 9:
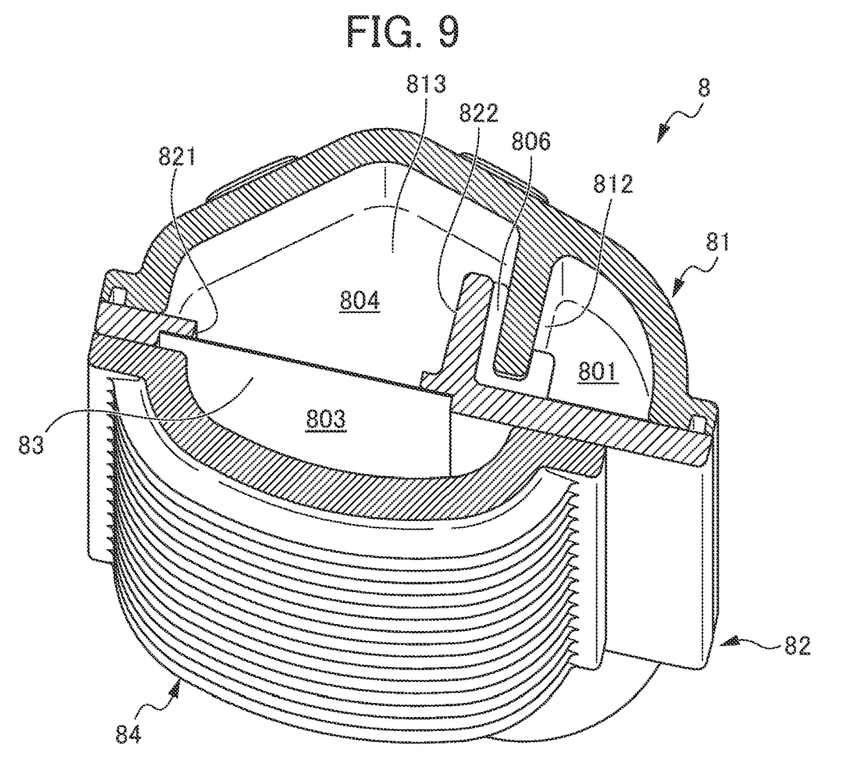
FIG. 9 is a front perspective cross-sectional view illustrating the protrusion part 8 of the substrate storing container 1.

As illustrated in, for example, FIGS. 8 and 9, the gas detention chamber 801 is constituted by a space surrounded by the protrusion part body 81, the inner wall component 82, and the inter-chamber partitions (the body-side partition 812 and the inner wall-side partition 822). The pre-outflow gas retention chamber 804 is constituted by a space surrounded by the protrusion part body 81, the inner wall component 82, the hydrophobic film 83 provided so as to close through holes formed in the inner wall component 82, and the inter-chamber partitions (the body-side partition 812 and the inner wall-side partition 822). The nozzle chamber 803 is constituted by a space surrounded by the inner wall component 82, the hydrophobic film 83 provided so as to close the through holes formed in the inner wall component 82, and the nozzle chamber forming component 84.

Figure 7:
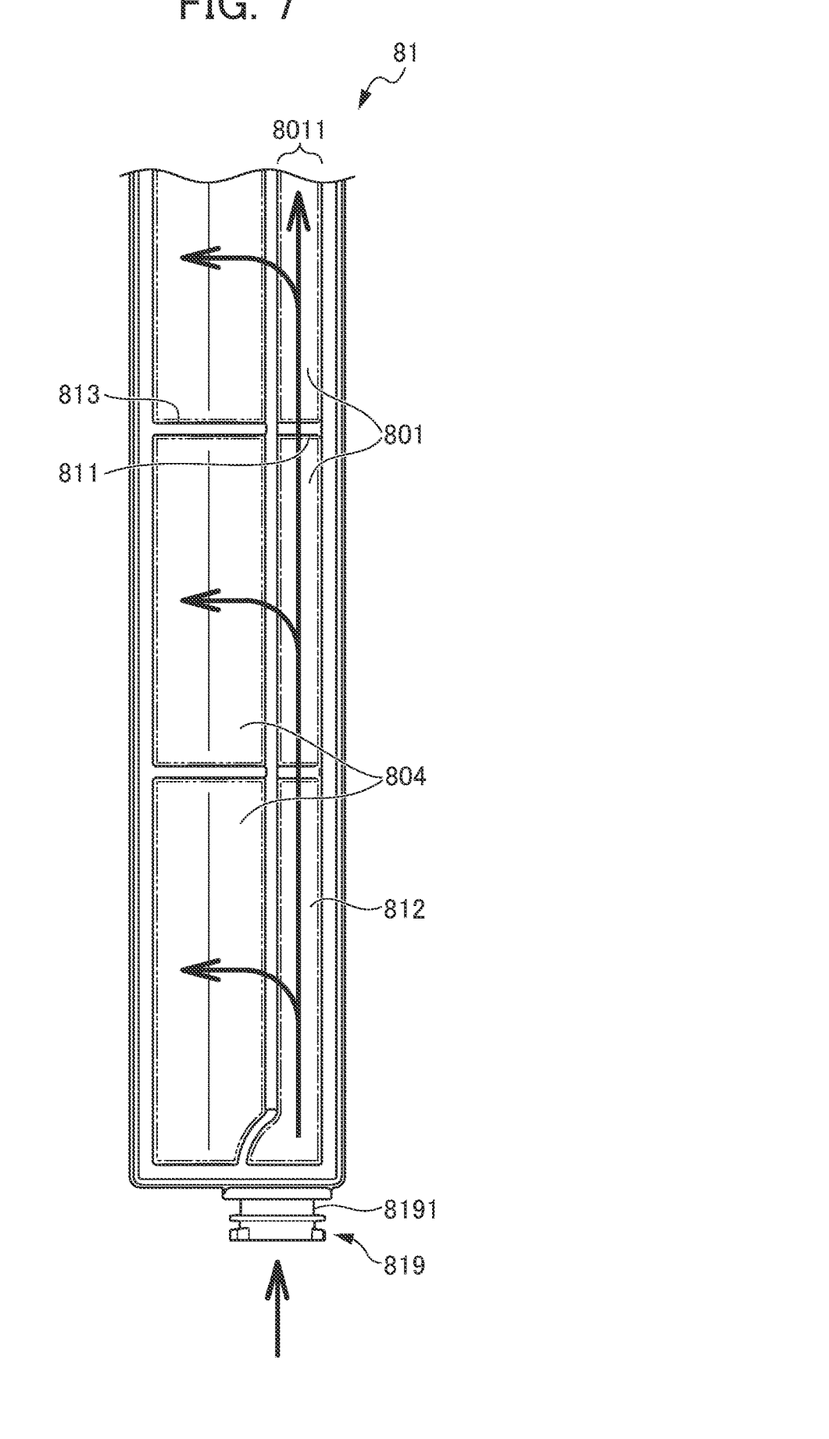
FIG. 7 is an exploded perspective view illustrating flows of a purge gas inside a protrusion part body 81 forming part of the protrusion part 8 of the substrate storing container 1.

As illustrated in FIGS. 6 and 7, the gas detention chamber 801 is partitioned into a plurality of gas detention sub-chambers by inter-sub-chamber partitions 811 arranged at predetermined intervals in the upward/downward direction. The inter-sub-chamber partitions 811 do not completely divide the gas detention chamber 801 or prevent a purge gas from flowing between the plurality of gas detention sub-chambers, but form a gas flow space 8011 between inter-sub-chamber partitions 811 and the inner wall component 82. This configuration allows the purge gas to flow between the gas detention sub-chambers adjacent to each other in the upward/downward direction.

The gas flow space 8011 does not allow for straight-line communication in the gas detention chamber 801 from the lowermost portion to the uppermost portion of the protrusion part 8 in the upward/downward direction. Specifically, the inner wall component 82 has inter-sub-chamber partitions 823 extending from the inner wall component 82 toward the interior of the gas detention chamber 801. Therefore, a purge gas that has flowed into the gas detention chamber 801 from the ventilation path of the intake filter unit 98 passes through the portion, which belongs to the gas detention chamber 801, communicates with all the gas detention sub-chambers, and is configured as the gas supply flow path 8011 having a cranked shape due to the inter-sub-chamber partitions 811 and the inter-sub-chamber partitions 823, and thereby flows from the lowermost end to the uppermost end of the gas detention chamber 801.

As illustrated in FIGS. 6 and 7, the pre-outflow gas retention chamber 804 is partitioned into a plurality of pre-outflow gas retention sub-chambers by partition walls 813 arranged at predetermined intervals in the upward/downward direction. The partition walls 813 completely divide the pre-outflow gas retention chamber 804 so that the purge gas is prevented from flowing between the plurality of pre-outflow gas retention sub-chambers. Therefore, the purge gas that flowed into each of the pre-outflow gas retention sub-chambers flows into the nozzle chamber 803 through the hydrophobic film 83. As illustrated in FIGS. 6 and 7, the plurality of pre-outflow gas retention sub-chambers partitioned by the partition walls 813 have an equal capacity.

The hydrophobic film 83 is fixed while being fitted in a recessed portion that is formed on the front side of the inner wall component 82 and surrounds a plurality of through holes 821 formed in the inner wall component 82. The hydrophobic film 83 is a film which has hydrophobicity and whose flow resistance does not change even when wetted at the time of cleaning the container body 2 of the substrate storing container 1. Specific examples of the hydrophobic film 83 include a porous film or sheet having air permeability and hydrophobicity, a coated product having hydrophobicity, and the like. In the present embodiment, a PTFE film is used.

Figure 10:
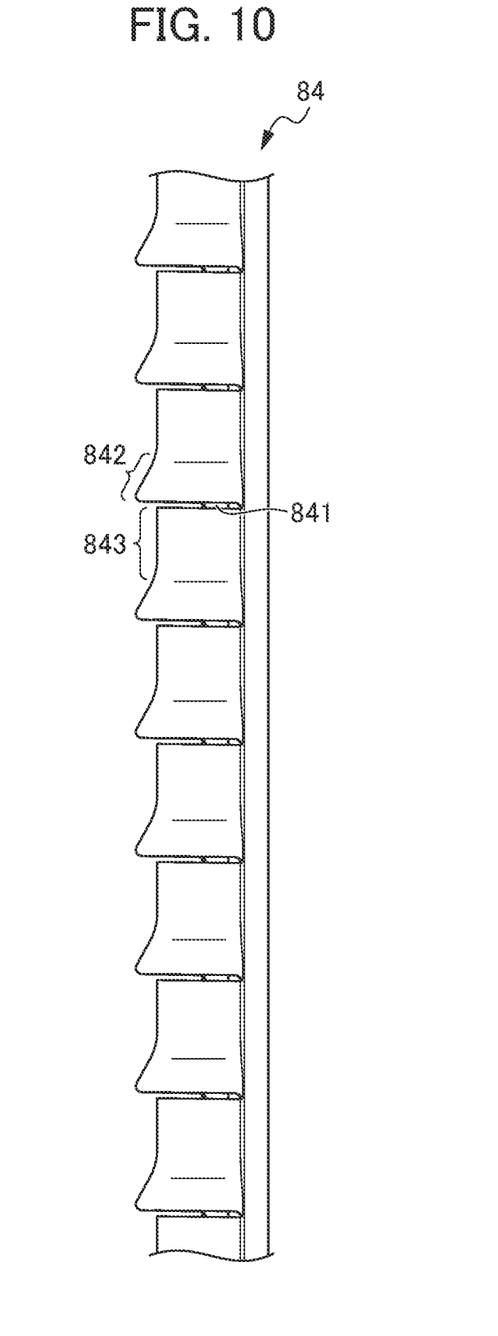
FIG. 10 is a side view illustrating a nozzle chamber forming component 84 forming part of the protrusion part 8 of the substrate storing container 1.

In the nozzle chamber 803, no inter-sub-chamber partition or partition wall is provided. Therefore, the nozzle chamber 803 is formed as one chamber continuing from the lower end to the upper end. As illustrated in FIG. 10, the plurality of apertures 841 are formed on the front side of the nozzle chamber forming component 84, which defines the nozzle chamber 803. The number of the apertures 841 is set such that the apertures 841 correspond, on a one-to-one basis, to the substrates W that the substrate storing space 27 can store; specifically, 25 apertures 841 are formed. The nozzle chamber 803 is in communication with all the apertures 841, and communicates, through the hydrophobic film 83, with all the pre-outflow gas retention sub-chambers, which are plural chambers partitioned by the partition walls 813.

As illustrated in FIG. 10, an inclined eave 842 is provided above each aperture 841. The inclined eave 842 is increasingly inclined in the downward direction D22 toward the forward direction D11 such that the inclined eave 842 protrudes in the forward direction D11 relative to the portion below the aperture 841. The inclined eaves 842 extend parallel to each other. The inclined eaves 842 inhibit a cleaning liquid from entering the nozzle chamber 803 through the apertures 841 when the container body 2 is cleaned.

Furthermore, each inclined eave 842 constitutes a flow-directing part that causes the gas to flow out through the aperture 841 in the downward direction D22.

[Lid 3]

As illustrated in FIG. 1, the lid 3 has a substantially rectangular shape that substantially coincides with the opening peripheral edge 28 of the container body 2. The lid 3 is detachably attachable to the opening peripheral edge 28 of the container body 2. When attached to the opening peripheral edge 28, the lid 3 can close the container body opening 21 while being in a positional relationship in which the lid 3 is surrounded by the opening peripheral edge 28.

In a state where the container body opening 21 is closed by the lid 3, the inner surface of the lid 3 (the backside surface of the lid 3 in FIG. 1) faces a surface (sealing surface 281) of a step portion located at a position immediately backward of the opening peripheral edge 28 in the backward direction D12. The inner surface of the lid 3 is provided with an annular sealing member 4 that is attached along the entire outer peripheral edge of the lid 3. The sealing member 4 annularly extends along the entire peripheral edge of the lid 3. Examples of the sealing member 4 include various thermoplastic elastomers such as polyester-based elastically deformable elastomers and polyolefin-based elastically deformable elastomers, fluorine rubber, and silicon rubber.

In a state where the lid 3 is fitted to the opening peripheral edge 28, the sealing member 4 is elastically deformed by being sandwiched between the sealing surface 281 of the container body 2 and the inner surface of the lid 3. That is, interposing the sealing member 4 between the lid 3 and the container body 2 makes it possible for the lid 3 to close the container body opening 21 in a state where the lid 3 and the opening peripheral edge 28 are separated from each other without contacting with each other. By detaching the lid 3 from the opening peripheral edge 28, the substrates W can be placed into and removed from the substrate storing space 27 in the container body 2.

The lid 3 is provided with a latch mechanism. As illustrated in FIG. 1, the latch mechanism is provided in proximity to the left and right ends of the lid 3, and include two upper latch parts 32A, 32A that can protrude from the upper side of the lid 3 in the upward direction D21, and two lower latch parts 32B, 32B that can protrude from the lower side of the lid 3 in the downward direction D22. The two upper latch parts 32A, 32A are disposed in proximity to the left and right ends of the upper side of the lid 3, and the two lower latch parts 32B, 32B are disposed in proximity to the left and right ends of the lower side of the lid 3.

The outer surface of the lid 3 is provide with operation parts 33. Operating the operation parts 33 from the front side of the lid 3 causes the upper latch parts 32A, 32A and the lower latch parts 32B, 32B to protrude from the upper side and the lower side of the lid 3 and to retract not to protrude from the upper side and the lower side of the lid 3. The upper latch parts 32A, 32A protrude from the upper side of the lid 3 in the upward direction D21 to engage with latch engagement recesses 231A, 231B of the container body 2, and the lower latch parts 32B, 32B protrude from the lower side of the lid 3 in the downward direction D22 to engage with latch engagement recesses 241A, 241B of the container body 2, whereby the lid 3 is fastened to the container body opening 21 of the container body 2.

On the inner side of the lid 3 (the side of the lid 3 in the backward direction D12 in FIG. 1), a recess (not shown) is formed which is concave outward with respect to the substrate storing space 27 (concave in the forward direction D11). The front retainer (not shown) is fixed to the recess.

The front retainer (not shown) has front retainer substrate receiving parts (not shown). The front retainer substrate receiving parts (not shown) are arranged in pairs while being spaced apart from each other by a predetermined distance in the left/right direction. 25 pairs of the front retainer substrate receiving parts forming counterparts to each other are arranged in parallel in the upward/downward direction. When the substrates W are stored in the substrate storing space 27 and the lid 3 is closed, the front retainer substrate receiving parts support edge portions of the substrates W.

Effects of the Embodiment

The substrate storing container 1 according to the present embodiment, which has the above-described configuration, exerts the following effects. The substrate storing container 1 according to the present embodiment includes: the container body 2, which has the opening peripheral edge 28 defining the container body opening 21 at one end thereof, and the wall 20 with a closed tubular shape at the other end thereof, and which includes the substrate storing space 27 defined by the inner surface of the wall 20, capable of the storing substrates W, and communicating with the container body opening 21; the lid 3 detachably attachable to the container body opening 21 and capable of closing the container body opening 21; the ventilation path (the gas flow path in the intake filter unit 98 and the gas flow path in the discharge filter unit 99) allowing for communication between the substrate storing space 27 and a space outside the container body 2; the protrusion parts 8 functioning as gas ejection nozzle units having the plurality of apertures 841 for supplying to the substrate storing space 27 a gas that has flowed into the ventilation path; and the gas flow rate equalizer (the gas detention chamber 801 and the pre-outflow gas retention chamber 804) capable of causing the gas to flow out from the plurality of apertures 841 at an equalized flow rate. The gas flow rate equalizer includes the gas detention chamber 801, the pre-outflow gas retention chamber 804, and the inter-chamber partitions (the body-side partition 812 and the inner wall-side partition 822) defining the inter-chamber flow path 806 that blocks straight-line communication between the gas detention chamber 801 and the pre-outflow gas retention chamber 804 but allows for communication between the gas detention chamber 801 and the pre-outflow gas retention chamber 804.

Due to this configuration, the purge gas detained in the gas detention chamber 801 can pass through the inter-chamber flow path 806 to flow into each of the plurality of pre-outflow gas retention sub-chambers of the pre-outflow gas retention chamber 804, flow into the nozzle chamber 803 to be retained therein, and equally flow out from each of the plurality of apertures 841 of the nozzle chamber forming component 84. As a result, the purge gas can be equally supplied from the plurality of apertures 841 to the substrates W stored in the substrate storing space 27.

According to the substrate storing container 1 of the present embodiment, the gas flow rate equalizer includes the partition walls 813 that partition the pre-outflow gas retention chamber 804 into the plurality of pre-outflow gas retention sub-chambers. Due to this configuration, the purge gas that has flowed into the pre-outflow gas retention chamber 804 is divided to flow into the plurality of pre-outflow gas retention sub-chambers, and is temporarily retained there. Thus, even when there is a difference among the amounts of the purge gas that have flowed into the plurality of pre-outflow gas retention sub-chambers, the purge gas is equalized in the pre-outflow gas retention sub-chambers during the temporary retention, and thereafter, the purge gas flows into the nozzle chamber 803. As a result, it is possible to prevent or inhibit the purge gas that has flowed into the nozzle chamber 803 from flowing strongly from predetermined one or more of the apertures 841.

According to the substrate storing container 1 of the present embodiment, the plurality of pre-outflow gas retention sub-chambers have an equal capacity. This configuration makes it possible to inhibit as much as possible the purge gas from flowing in different amounts into the nozzle chamber 803 from predetermined ones of the pre-outflow gas retention sub-chambers through the hydrophobic film 83.

According to the substrate storing container 1 of the present embodiment, the gas detention chamber 801 is partitioned into the plurality of gas detention sub-chambers by the inter-sub-chamber partitions 811. This configuration makes it possible to prevent or inhibit the purge gas that has flowed into the lower end portion of the gas detention chamber 801 from rushing to the upper end portion of the gas detention chamber 801. Thus, it is possible to prevent or inhibit a large amount of the purge gas from flowing to the upper end portion of the gas detention chamber 801.

The substrate storing container 1 of the present embodiment includes the gas flow space 8011 functioning as a gas supply flow path communicating with all the gas detention sub-chambers. This configuration allows the purge gas that has flowed into the gas detention chamber 801 to communicate with all the gas detention sub-chambers, and to flow from the gas detention sub-chambers to the pre-outflow gas retention sub-chambers constituting the pre-outflow gas retention chamber 804.

According to the substrate storing container 1 of the present embodiment, the protrusion parts 8 functioning as the gas ejection nozzle units each have the nozzle chamber 803 in communication with the apertures 841, and the nozzle chamber 803 communicates with the pre-outflow gas retention chamber 804 via the hydrophobic film 83. Due to this configuration, when the container body 2 of the substrate storing container 1 is cleaned, the hydrophobic film 83, the flow resistance of which does not change, makes it possible to prevent a cleaning liquid from entering the pre-outflow gas retention chamber 804.

According to the substrate storing container 1 of the present embodiment, the nozzle chamber 803 communicates with all the apertures 841 and all the gas pre-outflow gas retention sub-chambers constituting the pre-outflow gas retention chamber 804. This configuration makes it possible to cause the purge gas that has flowed into all the pre-outflow gas retention sub-chambers constituting the pre-outflow gas retention chamber 804 to flow into the nozzle chamber 803 communicating with all the apertures 841.

According to the substrate storing container 1 of the present embodiment, the protrusion parts 8 functioning as the gas ejection nozzle units have the inclined eaves 842 functioning as the flow-directing parts that cause the gas to flow out from the apertures 841 in a predetermined direction. This configuration makes it possible to prevent or inhibit the cleaning liquid from flowing through the apertures 841 into the nozzle chamber 803 at the time of cleaning the container body 2.

According to the substrate storing container 1 of the present embodiment, the apertures 841 are formed to correspond to the plurality of substrates W stored in the substrate storing space 27, on a one-to-one basis. This configuration, in which the flow of the purge gas coming out from one aperture 841 is assigned to one substrate W, reliably allows the purge gas to flow to each of the substrates W.

The substrate storing container 1 of the present embodiment includes the columnar protrusion part 8 including the gas ejection nozzle unit and the gas flow rate equalizer, and the base 819 of the protrusion part 8 is fitted into a hole formed in the wall 20 of the container body 2, constituting the ventilation path, and provided with a sealing member, and the end portion of the protrusion part 8 is fastened to the wall 20 of the container body 2, whereby the protrusion part 8 is fastened to the container body 2. This configuration makes it possible to easily and reliably fasten the protrusion part 8 to the container body 2.

Modifications

The present invention is not limited to the embodiment described above, and modifications can be made within the technical scope specified in the claims.

For example, in an embodiment, the configurations of the constituent components of the protrusion part are not limited to the configurations of the protrusion part body 81, the inner wall component 82, the hydrophobic film 83, the nozzle chamber forming component 84, and the like constituting the protrusion part 8.

Furthermore, the shape of the container body and the shape of the lid are not limited to the shape of the container body 2 and the shape of the lid 3 of the above embodiment. Moreover, the number and dimensions of the substrates W that the container body 2 can store are not limited to those described in the above embodiment.

EXPLANATION OF REFERENCE NUMERALS

1: Substrate storing container
2: Container body
3: Lid
5: Lateral-side substrate support
6: Back-side substrate support
8: Protrusion part
20: Wall
21: Container body opening
25: First side wall (side wall)
26: Second side wall (side wall)
27: Substrate storing space
83: Hydrophobic film
801: Gas detention chamber (Gas flow rate equalizer)
803: Nozzle chamber
804: Pre-outflow gas retention chamber (Gas flow rate equalizer)
811: Inter-sub-chamber partition
812: Body-side partition (Inter-chamber partition)
813: Partition wall
819: Base
822: Inner wall-side partition (Inter-chamber partition)
841: Aperture
842: Inclined eave (Flow-directing part)
8011: Gas flow space
W: Substrate

The invention claimed is:

1. A substrate storing container comprising:
   a container body having an opening peripheral edge defining a container body opening at one end thereof, and a wall with a closed tubular shape at an other end thereof, and including a substrate storing space formed therein, the substrate storing space being defined by an inner surface of the wall, being capable of storing a substrate, and communicating with the container body opening;
   a lid detachably attachable to the container body opening and capable of closing the container body opening;
   a ventilation path allowing for communication between the substrate storing space and a space outside the container body;
   a gas ejection nozzle unit having a plurality of apertures for supplying to the substrate storing space a gas that has flowed into the ventilation path; and
   a gas flow rate equalizer capable of causing the gas to flow out from the plurality of apertures at an equalized flow rate,
   the gas flow rate equalizer comprising a gas detention chamber, a pre-outflow gas retention chamber, and an inter-chamber partition, the inter-chamber partition defining an inter-chamber flow path that blocks straight-line communication between the gas detention chamber and the pre-outflow gas retention chamber but allows for communication between the gas detention chamber and the pre-outflow gas retention chamber, wherein in the pre-outflow gas retention chamber, the inter-chamber flow path opens in a direction opposite to a direction toward the plurality of apertures.

2. The substrate storing container according to claim 1, wherein
the gas flow rate equalizer further includes a partition wall that partitions the pre-outflow gas retention chamber into a plurality of pre-outflow gas retention sub-chambers.

3. The substrate storing container according to claim 2, wherein
the plurality of pre-outflow gas retention sub-chambers have an equal capacity.

4. The substrate storing container according to claim 3, wherein
the gas detention chamber is partitioned into a plurality of gas detention sub-chambers by an inter-sub-chamber partition.

5. The substrate storing container according to claim 4, wherein
a gas supply flow path communicating with all the gas detention sub-chambers is formed.

6. The substrate storing container according to claim 2, wherein
the gas ejection nozzle unit includes a nozzle chamber that is in communication with the apertures, and
the nozzle chamber communicates with the pre-outflow gas retention chamber via a hydrophobic film.

7. The substrate storing container according to claim 6, wherein
the nozzle chamber communicates with all the apertures and all the gas pre-outflow gas retention sub-chambers.

8. The substrate storing container according to claim 1, wherein
the gas ejection nozzle unit has a flow-directing part that causes the gas to flow out from the aperture in a predetermined direction.

9. The substrate storing container according to claim 1, wherein
the apertures are formed to correspond to a plurality of substrates stored in the substrate storing space on a one-to-one basis.

10. The substrate storing container according to claim 1, comprising:
a protrusion part having a columnar shape and including the gas ejection nozzle unit and the gas flow rate equalizer, wherein
a base of the protrusion part is fitted into a hole formed in the wall of the container body, constituting the ventilation path, and provided with a sealing member, and an end portion of the protrusion part is fastened to the wall of the container body, whereby the protrusion part is fastened to the container body.

* * * * *